United States Patent
Kobayashi (10) Patent No.: US 7,218,175 B1
(45) Date of Patent: May 15, 2007

(54) DYNAMIC FEEDBACK LINEARIZATION

(75) Inventor: Kevin W. Kobayashi, Torrance, CA (US)

(73) Assignee: Sirenza Microdevices, Inc., Broomfield, CO (US)

( * ) Notice: Subject to any disclaimer, the term of this patent is extended or adjusted under 35 U.S.C. 154(b) by 23 days.

(21) Appl. No.: 11/103,149

(22) Filed: Apr. 11, 2005

(51) Int. Cl.
*H03F 1/30* (2006.01)

(52) U.S. Cl. .................. 330/290; 330/97; 330/296

(58) Field of Classification Search .............. 330/290, 330/259, 291; 327/77
See application file for complete search history.

(56) References Cited

U.S. PATENT DOCUMENTS

| | | | |
|---|---|---|---|
| 4,092,613 A | 5/1978 | Boubouleix | 330/289 |
| 4,491,804 A | 1/1985 | Main et al. | 330/265 |
| 5,177,449 A * | 1/1993 | Asazawa | 330/252 |
| 5,710,523 A | 1/1998 | Kobayashi et al. | 330/293 |
| 6,300,837 B1 | 10/2001 | Sowlati et al. | 330/296 |
| 6,720,831 B2 * | 4/2004 | Dening et al. | 330/298 |
| 6,735,424 B1 | 5/2004 | Larson et al. | 455/250.1 |
| 6,784,739 B2 | 8/2004 | Reffay et al. | 330/267 |
| 6,791,418 B2 | 9/2004 | Luo et al. | 330/296 |

OTHER PUBLICATIONS

J.H. Kim et al., "MMIC Power Amplifier Adaptively Linearized With RF COupled Active Bias Circuit For W-CDMA Mobile Terminals Applications", IFTH-44, 2003 IEEE MTT_S Digest, pp. 2209-2212.
L.A.D. van den Broeke et al., IEEE Journal of Solid-State Circuits, "Wide-Band Integrated Optical Receiver with Improved Dynamic Range Using a Current Switch at the Input", vol. 28, No. 7, Jul. 1993, pp. 862-864.

* cited by examiner

*Primary Examiner*—Robert Pascal
*Assistant Examiner*—Alan Wong
(74) *Attorney, Agent, or Firm*—Christopher P. Maiorana, PC (57) ABSTRACT

An apparatus comprising an amplifier comprising at least one amplifier transistor, a threshold detection network and a bypass capacitor. The amplifier may be configured to generate an output signal at a collector in response to an input signal received at a base. The threshold detection network may be coupled between the collector and the base of the amplifier transistor. The threshold detection network may include a bias transistor having a collector coupled to the collector of the amplifier transistor and an emitter coupled to the base of the amplifier transistor. The threshold detection circuit may be configured to (i) sense a feedback current and (ii) provide a DC signal to the base of the amplifier transistor for dynamically sourcing bias current to the amplifier. The bypass capacitor may be coupled to the base of the bias transistor.

19 Claims, 13 Drawing Sheets

BASIC DYNAMIC ACTIVE
FEEDBACK BIAS NETWORK
APPLIED TO A DARLINGTON
AMPLIFIER WITH SELF-BIAS

DYNAMIC FEEDBACK LINEARIZATION

FIELD OF THE INVENTION

The present invention relates to amplifiers generally and, more particularly, a method and/or architecture for implementing dynamic feedback linearization that may be used in a low noise gain block or power amplifier.

BACKGROUND OF THE INVENTION

For new wireless systems such as WLAN and Wi-MAX, power amplifiers with high linear efficiencies are needed. Some sort of class AB or dynamic biasing is typically used to obtain high linear efficiencies. Other applications such as high dynamic range receivers can also benefit from dynamic biasing. Such receivers improve the input compression of a low noise amplifier (LNA).

Conventional approaches implement class AB configurations as a popular solution. Many implementations are used, most of which include external manual tuning of resistors. Such implementations have extra control ports, and can be very sensitive to process or temperature variations.

Figure 1:
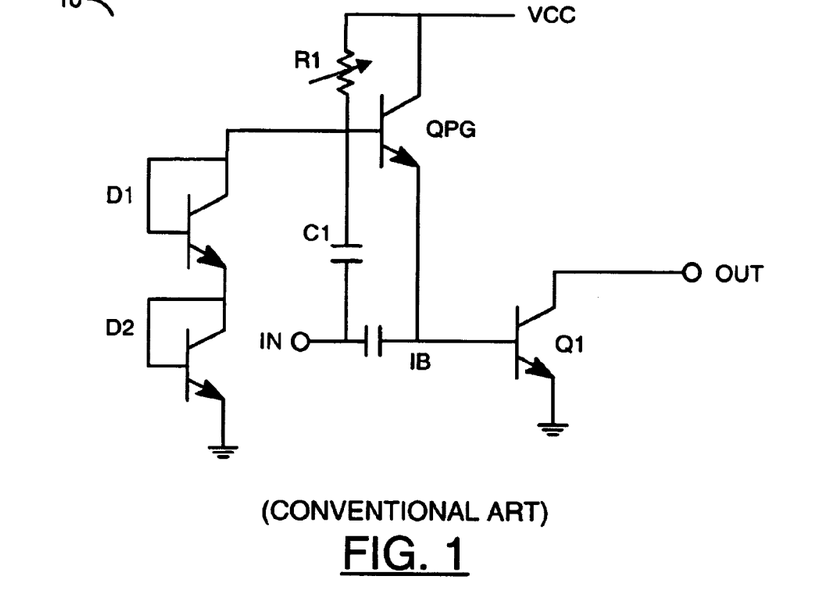
FIG. 1 is a block diagram of a conventional class AB circuit.

Referring to FIG. 1, an example of a circuit 10 illustrating a conventional approach is shown. The circuit 10 illustrates a traditional class AB bias circuit applied to a power amplifier transistor Q1. Many conventional class AB circuits implement a pass gate QPG, which supplies a base current IB to amplifier transistor Q1. The base current is received from the supply VCC. As input power is increased, the base current IB increases. Conventional approaches include diode temperature compensation D1 and D2, which are often added to provide stability over temperature. A resistor R1 is typically externally adjusted in order to set the quiescent current of the transistor Q1. A coupling capacitor C1 detects and integrates an RF input signal IN. The coupling capacitor C1 increases the voltage applied to the pass gate transistor QPG in order to provide more base current to the transistor Q1 when under drive.

The circuit 10 has one or more of the following deficiencies (a) needing an additional supply VCC input pin which is incompatible with a SOT89 package configuration, (b) needing manual tuning of the resistor R1 in order to set the bias current of the transistor Q1 that is not very stable, and (c) providing a detection circuit that is open loop.

Figure 2:
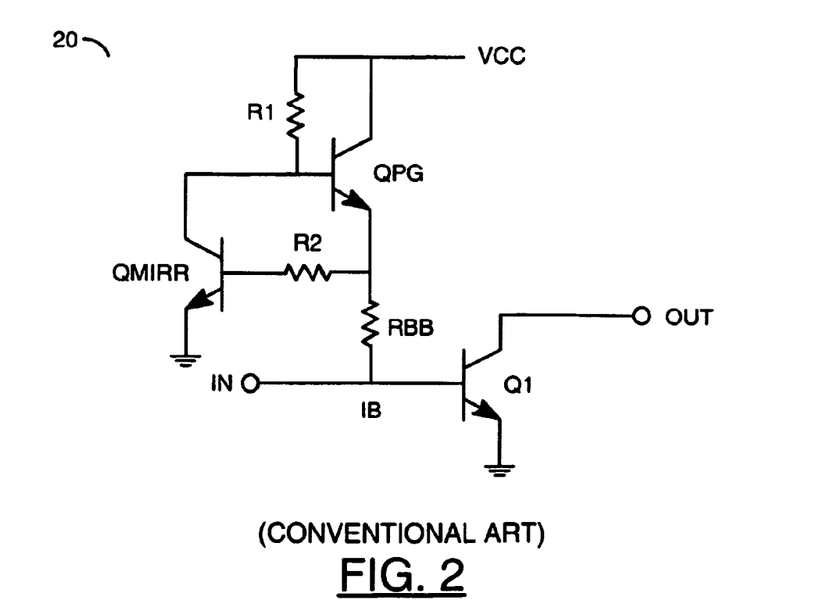
FIG. 2 is a diagram of another conventional circuit.

Referring to FIG. 2, a circuit 20 illustrating another conventional approach is shown. The circuit 20 illustrates a variation of the popular class AB bias. The circuit 20 uses a current mirror implemented as a mirror transistor QMIRR. The transistor QMIRR sets the quiscent bias. The quiscent bias adjustment allows substantially less process sensitivity compared to the bias network 10 of FIG. 1. Similar to the circuit 10, the circuit 20 uses a pass gate transistor QPG for the supplying base current IB to the amplifier transistor Q1 under RF input drive.

The circuit 20 also uses a separate supply voltage/input pin for operation of the pass gate transistor QPG. Unlike the circuit 10, the circuit 20 does not include a feed-forward coupling capacitor to enhance the class AB action. The circuit 20 also illustrates a series base resistor RBB. The size of the base resistor RBB determines the amount of class AB action that is attainable. The circuit 20 also uses an open loop configuration.

It would be desirable to implement a compact class AB dynamic feedback bias that may (i) be implemented without (a) external resistor tuning and (b) additional dedicated control ports, (ii) be implemented with a two terminal gain block, such as a Darlington feedback amplifier, and/or (iii) be implemented without being sensitive to process and/or temperature variations.

SUMMARY OF THE INVENTION

The present invention concerns an apparatus comprising an amplifier comprising at least one amplifier transistor, a threshold detection network and a bypass capacitor. The amplifier may be configured to generate an output signal at a collector in response to an input signal received at a base. The threshold detection network may be coupled between the collector and the base of the amplifier transistor. The threshold detection network may include a bias transistor having a collector coupled to the collector of the amplifier transistor and an emitter coupled to the base of the amplifier transistor. The threshold detection circuit may be configured to (i) sense a feedback current and (ii) provide a DC signal to the base of the amplifier transistor for dynamically sourcing bias current to the amplifier. The bypass capacitor may be coupled to the base of the bias transistor.

The objects, features and advantages of the present invention include providing an active feedback dynamic bias circuit that may (i) be compact and cost effective, (ii) be implemented with Darlington gain blocks and/or matched power amplifiers, (iii) use a dynamic feedback bias network including a transistor in parallel with a threshold sensing network, such as a resistive divider, (iv) implement a bypass capacitor to remove the dynamic feedback network from the RF feedback path, (v) implement a base bypass capacitor to allow average threshold detection, (vi) provide a DC feedback limiting resistor for setting the maximum dynamic bias current of the transistor (vii) provide a dynamic feedback network that may be applied between an input and an output of an amplifier or Darlington gain block (viii) implement dynamic feedback bias without external components, external control pins, or I/O pins for control, (ix) be implemented in a SOT89 package or equivalent two I/O and one GND package, (x) be implemented with a simple and cost effective approach, and/or (xi) be controllable.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may implement a dynamic feedback linearization circuit. The present invention may offer several degrees of freedom to shape the manner in which a base current and/or collector current ramps up with input power. Such an implementation may allow a user to distinctly control the dynamic amplitude, phase, bias current response, and linear dynamic range.

Figure 3:
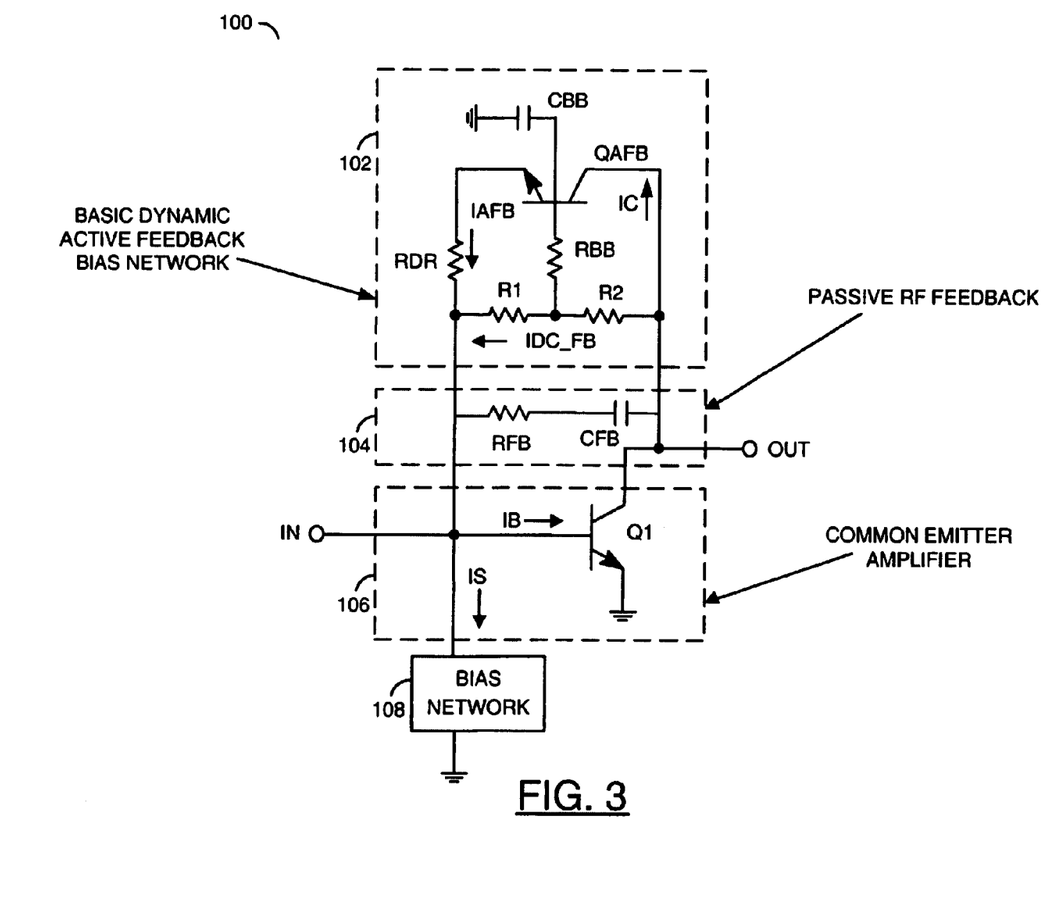
FIG. 3 is a block diagram illustrating a preferred embodiment of the present invention.

Referring to FIG. 3, a block diagram of a circuit 100 is shown in accordance with a preferred embodiment of the present invention. The circuit 100 generally comprises a block (or circuit) 102, a block (or circuit) 104, a block (or circuit) 106 and a block (or circuit) 108. The circuit 102 may be implemented as a dynamic active feedback bias network. The circuit 104 may be implemented as a passive RF feedback circuit. The circuit 106 may be implemented as an amplifier circuit. The circuit 108 may be implemented as a bias circuit. The circuit 102 generally comprises a transistor QAFB, a capacitor CBB, a resistor RDR, a resistor RBB, a resistor R1, and a resistor R2.

The circuit 100 illustrates a basic implementation of the active feedback dynamic bias network (DBN) 102 as applied to a common-emitter feedback amplifier stage 106. The dynamic bias circuit 102 is normally applied between the collector output and base input of the common-emitter amplifier 106. However, other configurations may be implemented to meet the design criteria of a particular implementation. For example, the amplifier 106 may be implemented as a Darlington amplifier (to be described in more detail in connection with FIG. 4), as a common-emitter amplifier or as another type of amplifier needed to meet the design criteria of a particular implementation. The passive feedback configuration 104 is shown as an (optional) example of one of many possible implementations of the dynamic bias circuit 102.

The dynamic bias network 102 normally operates by being applied in parallel with the passive feedback network 104. The network 104 comprises a resistor RFB and a capacitor CFB, each applied to a common-emitter amplifier transistor Q1. The bias network 108 may provide a shunt to ground. The input bias network 108 may be implemented as a bias resistor (e.g., with a conventional resistive feedback bias application), an active current source, or even a current mirror for setting the quiescent bias of the transistor Q1.

Under normal DC bias operation, a DC current IDC_FB flows through the resistors R1 and R2. The resistors R1 and R2 operate as a resistive feedback biasing network. The transistor QAFB is normally off in the absence of an RF input drive. As the RF input drive level is increased, the transistor Q1 begins to pull a base current IB in order to allow a collector current IC to ramp up for class AB operation.

As the current IDC_FB begins to increase to accommodate the initial demand for more base current IB from the transistor Q1, an increased voltage drop across the resistor R1 develops. The voltage drop turns on the transistor QAFB, delivering a reservoir of current IAFB. The current IAFB is provided to the base of the transistor Q1. The circuit 102 reacts to the RF parameters of the output amplifier stage 106 by providing the base current IB through the dynamic active feedback network 106 as RF input excitation increases.

The resistors R1 and R2, and the DC feedback bias current IDC_FB, may be adjusted in order to change the threshold where the dynamic active bias network 102 turns-on as a function of RF input power. Such a threshold adjustment may be done by adjusting the nominal voltage drop across the resistor R1 with respect to the base to emitter voltage (VBE) turn-on voltage of the transistor QAFB.

The shape of the current IAFB (and the slope by which the current IAFB ramps up with input power) supplying the base current IB to the transistor Q1 may be adjusted by changing the values of the resistors RDR, R1, and R2, and the current IDC_FB. The base current IB may be adjusted by adjusting the resistor RDR. The resistor RDR may be implemented as a finite resistor or other appropriate resistor to meet the design criteria of a particular implementation. The larger the value of the resistor RDR, the more DC feedback within the dynamic bias network 102 and the more gradual the current IAFB that will be supplied by the transistor QAFB as input power increases. A large value for the resistor RDR will normally limit the maximum amount of current supplied by the transistor QAFB. The lower the resistance RDR (i) the less inhibited the network 102 will be to supplying the current IAFB to the base of the transistor Q1 and (ii) the faster the network 102 will be able to deliver the current IAFB with respect to RF input power. The slope of the supplied dynamic current IAFB determines the amount of dynamic bias action. By adjusting the resistor RDR and/or the ratio of resistors R1 and R2, dynamic class B bias performance may be tailored for optimal linearity and/or efficiency response. By adjusting either or both of the resistors R1 and/or R2, predistortion characteristics may be tuned to linearize a successive output power amplifier stage. The base resistance RBB and the bypass capacitor CBB are used to set (i) an integration time constant or (ii) the integration time of the DC voltage that is applied to the base of the active feedback transistor QAFB.

The circuit 100 may be implemented without an additional supply and without additional externally accessible pins. The present invention may be compatible with a typical SOT89 package. A SOT89 package normally includes two input/output pins (I/Os) and one ground pin. The detection circuit 102 operates by detecting a feedback current. The detection circuit 102 may be easily applied to Darlington gain blocks as well as common-emitter power amplifier stages. The input power threshold of the dynamic bias network 102 may be precisely set by adjusting the resistors R1 and R2 during fabrication. The degree of the dynamic biasing or class AB action may be set by adjusting the resistor RDR during fabrication. The threshold setting is normally a function of a bias current IDC_FB, which may provide electronic tuning. Such tuning may be useful for predistortion applications or an "active Doherty" implementations (to be described in connection with FIGS. 5 and 6).

Figure 4:
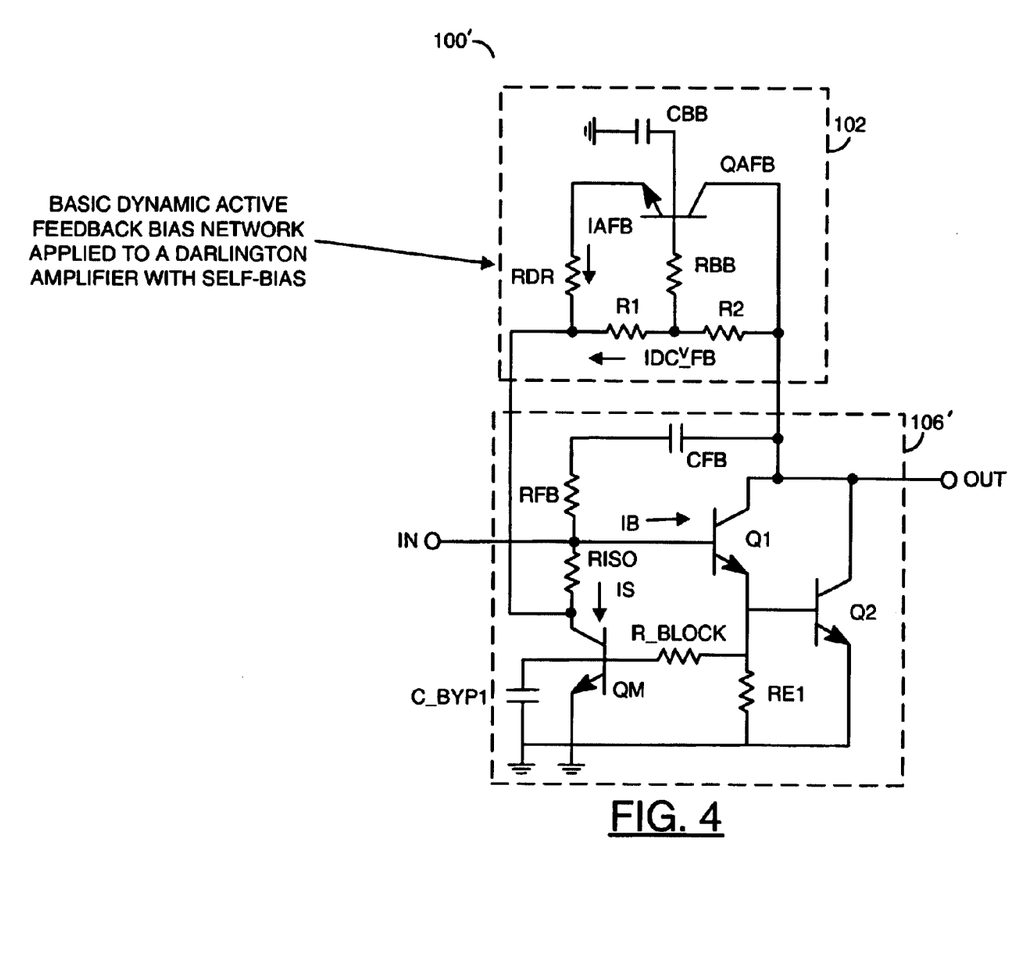
FIG. 4 is a block diagram illustrating another embodiment of the present invention.

Referring to FIG. 4, a circuit 100' is shown illustrating an embodiment of the invention where the dynamic bias network 102 is applied to a self-biased Darlington feedback amplifier 106'. A more detailed description of the circuit 106' may be found in application Ser. No. 10/623,070, filed Jul. 18, 2003, now U.S. Pat. No. 6,927,634, which is incorporated by reference in its entirety. In the context of the circuit 100', the dynamic bias network 102 is coupled between a collector output and a base input of the Darlington amplifier 106'. The dynamic bias network 102 is normally coupled to the input base of the Darlington 106' through an isolation resistor RISO. The Darlington amplifier generally comprises a transistor Q1 and a transistor Q2. A bias transistor QM may also be implemented. A capacitor (e.g., C_BYP1) may be connected between a base of the transistor QM and ground. A resistor (e.g., R_BLOCK) may be connected to the transistor QM to implement RF blocking. An input signal (e.g., IN) is normally presented to a base of the transistor Q1. An output signal (e.g., OUT) is generated at the collectors of the transistors Q1 and Q2. The isolation resistor RISO provides a high impedance path at low frequencies. A high impedance may improve the wideband and low frequency performance in the Darlington amplifier 106'. The resistor RE1 may be implemented as a bias resistor that sets the bias current of the transistor Q1. A passive feedback network RFB and CFB provides RF feedback to set the broadband response of the amplifier 106'. The resistor R1 and the resistor R2 help to set the self-bias of the Darlington feedback amplifier 106'.

The resistors R1 and R1 are also part of the dynamic active feedback bias network 102. The combined value of the resistors R1 and R2 sets the quiescent bias of the Darlington amplifier 106'. The ratio of the resistors R1 and R2 may also be used to independently set the DC threshold of the dynamic bias transistor QAFB. The same two resistors R1 and R2 may be used to set the quiescent bias of, the Darlington 106', but may also be used to independently set the threshold of the dynamic bias circuit 102. The elements, features and functions of the dynamic bias network 102 are similar between FIG. 3 and FIG. 4.

Figure 5:
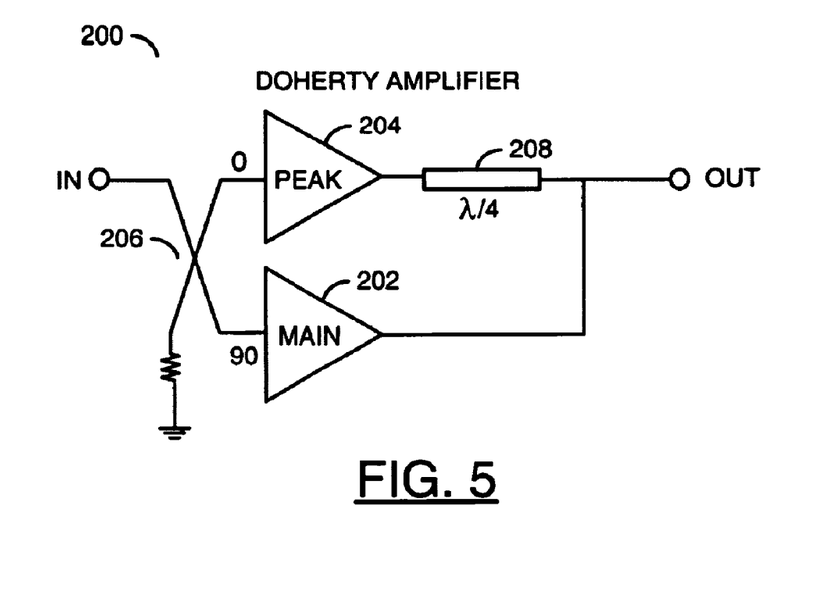
FIG. 5 is a diagram illustrating a Doherty amplifier.

Referring to FIG. 5, an example of a Doherty amplifier 200 is shown. The dynamic bias network 102 may be used to emulate a Doherty amplification in order to obtain higher linearity and/or power efficiency over a broader power range where there are essentially two amplifiers operating in parallel. The Doherty amplifier 200 includes a main amplifier 202, a peak amplifier 204, a 90 degree input coupler 206 and a quarter wave transformer 208. The main amplifier 202 operates as a class A linear amplifier. The peak amplifier 204 operates as a class B amplifier. The main amplifier 202 linearly amplifies signal levels up to a limit of linear operation before clipping. The peak amplifier 204 begins to turn on in order to accommodate the linear amplification of the additional signal level or "peak" signal. In this manner, the additional signal level which would otherwise be clipped by the main amplifier 202 will get amplified by the peak amplifier 204. An additional aspect of the operation of the Doherty amplifier 200 is that the quarter wave transformer 208 combined with the 90 degree coupled input 206 is configured to provide a dynamic load at the output of the amplifier 200. As the peak amplifier 204 turns on, the load of the Doherty amplifier 200 decreases, which maximizes efficiency when the dynamic bias network 102 is applied to the Doherty style amplifiers (to be described in FIGS. 6 and 7).

In one example, the dynamic bias network 102 may be applied directly to the traditional Doherty amplifier 200 of FIG. 5. The dynamic bias network 102 may provide benefits such as the ability to adjust the threshold of the peak detection during optimization of the Doherty amplifier 200. The dynamic bias network 102 may also benefit non-traditional Doherty style applications which do not implement couplers to provide dynamic loads.

Figure 6:
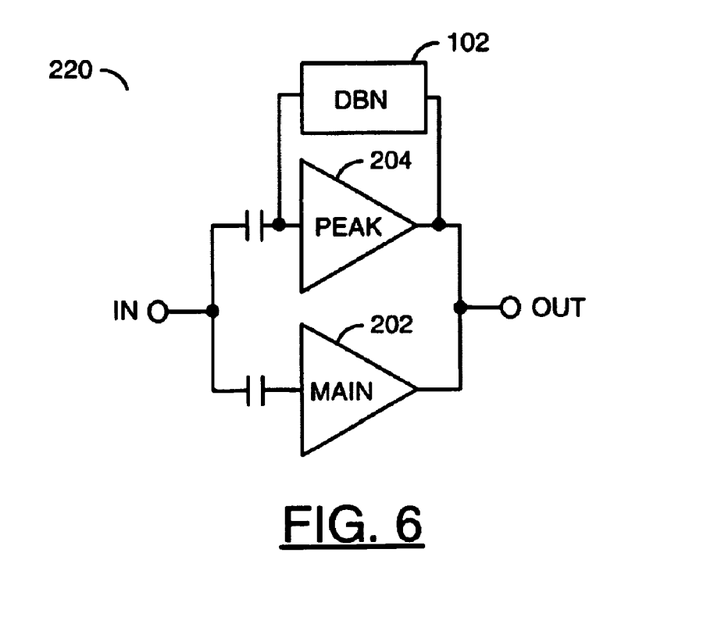
FIG. 6 is a diagram illustrating a configuration of the present invention in the context of a Doherty amplifier.

Referring to FIG. 6, a circuit 220 is shown illustrating an example of a Doherty-style parallel combination of a class A main amplifier 202 and a class B peak amplifier 204 in combination with the dynamic bias network 102. The circuit 220 does not include the 90 degree input coupler 206 and the output quarter wave transformer 208 as in the traditional Doherty amplifier 200 of FIG. 5. In the Doherty style amplifier circuit 220 of FIG. 6, the dynamic bias network 102 is applied to the peak amplifier 204. The peak amplifier 204 may have a threshold that may be adjusted by changing the ratio of the resistors R1 and R2 in order to optimize the linearity and power efficiency response of the overall parallel amplifier combination.

Figure 7:
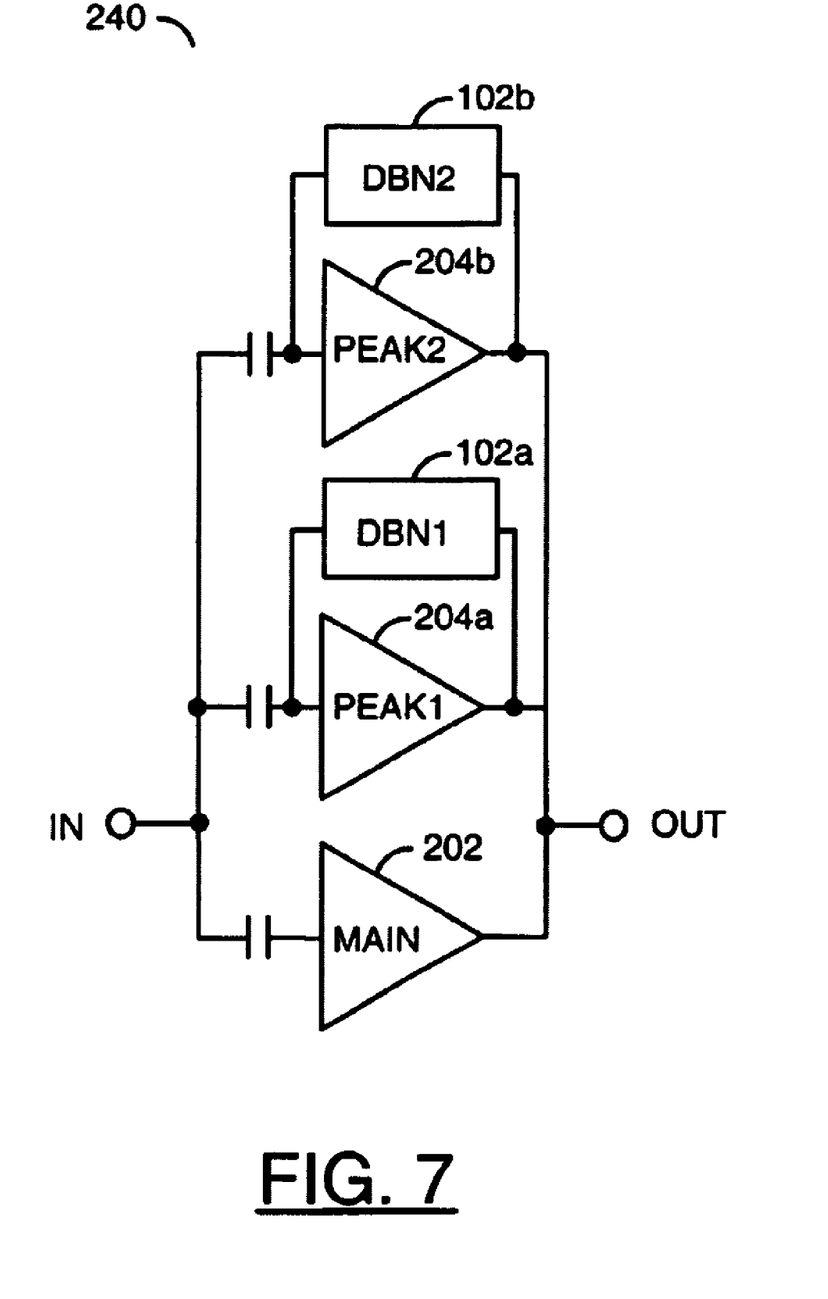
FIG. 7 is a diagram illustrating a configuration of the present invention in the context of a Doherty amplifier.

Referring to FIG. 7, a circuit 240 illustrating another application of the dynamic bias network 102 is shown. The circuit 240 illustrates a parallel combination of a main amplifier 202 and 1 two peak amplifiers 204a and 204b. The peak amplifiers 204a and 204b have separate dynamic bias network circuits 102a and 102b. The dynamic bias network circuits 102a and 102b may have different thresholds in order to further maximize linearity and efficiency across a broader power range. The dynamic bias network circuits 102a and 102b may be applied to a plurality of peak amplifiers 204a-204n in parallel with a class A linear main amplifier 202 for the purpose of optimizing performance over a wide dynamic range.

Figure 8:
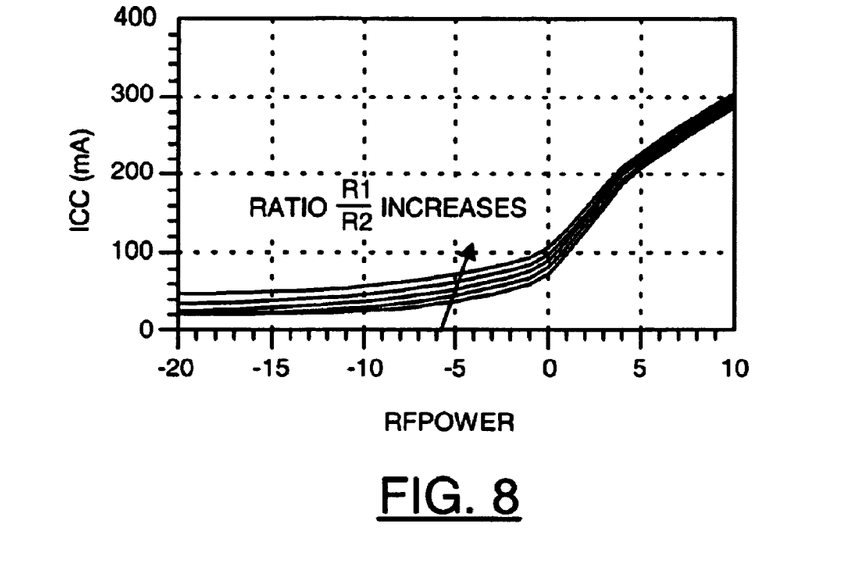
FIG. 8 is a diagram illustrating current versus input power.

The tuning capability of the dynamic bias network 102 and the resulting impact on the RF characteristics may be analyzed in the context of a self-bias Darlington amplifier 106, as shown in FIG. 4. FIG. 8 illustrates that by increasing the ratio R1/R2 of the resistors R1 and R2, the threshold where the current starts to ramp up with input power decreases. The net result is a change in the amplifier bias current ICC versus RF input power. Specifically, the amplifier current changes less over the input power range and therefore has less of a dynamic response. When the ratio R1/R2 of the resistors R1 and R2 is increased enough, current begins to flow through the transistor QAFB under the absence of RF drive and begins to increases the quiescent bias current, reducing the dynamic bias operation.

Figure 9:
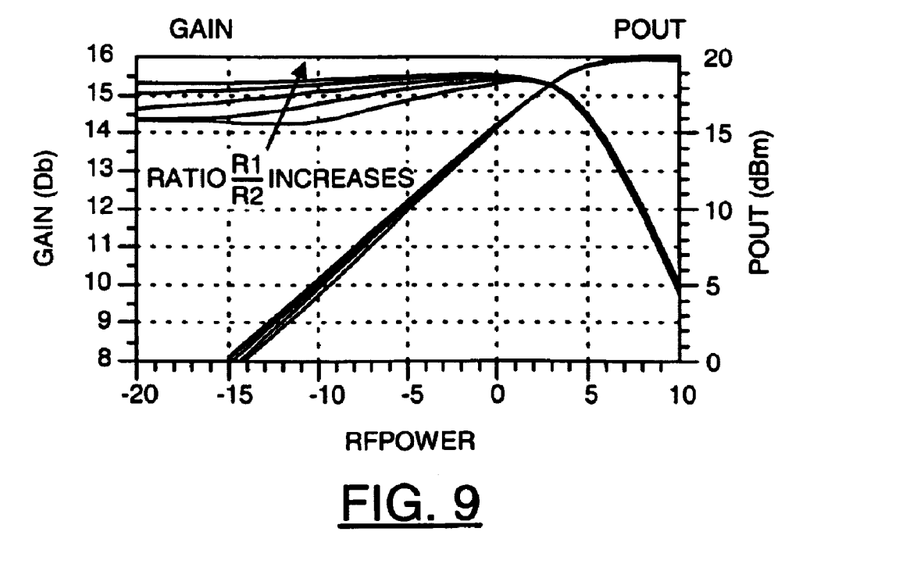
FIG. 9 is a diagram illustrating gain and output power versus input power.

FIG. 9 illustrates that as the ratio R1/R2 of the resistors R1 and R2 increases, the gain expansion becomes inhibited since the amplifier bias current ICC traverses less dynamic range.

Figure 10:
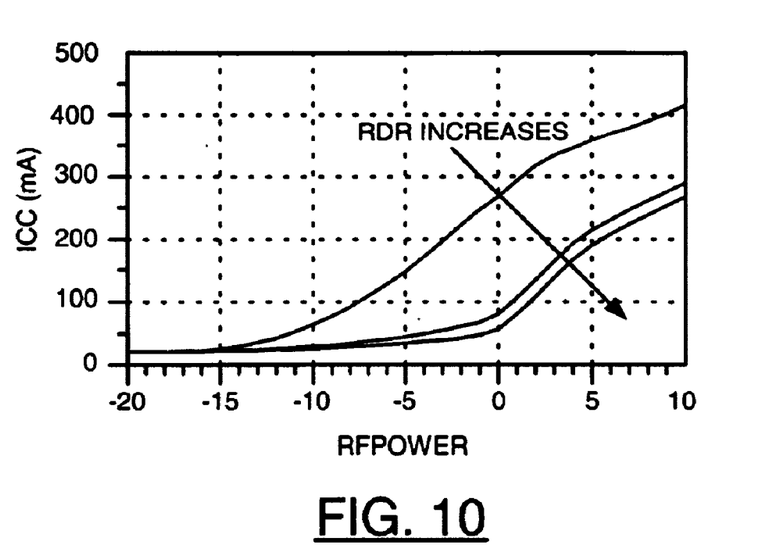
FIG. 10 is a diagram illustrating current versus input power.

Referring to FIG. 10, a graph showing a larger resistor RDR increasing the threshold where the amplifier current ICC turns on. The ratio R1/R2 of the resistors R1 and R1 is one of two ways to adjust and optimize the dynamic operation of the amplifier. The other parameter which can be used to adjust the dynamic bias operation of the amplifier is the resistance RDR. By increasing the value of the resistance RDR, more DC feedback is invoked in the dynamic bias network 102 which inhibits the supply of dynamic current IAFB provided by the transistor QAFB. This in turn inhibits the amplifier bias current ICC from increasing. FIG. 10 shows that as the resistor RDR is increased, the amount of maximum dynamic current IAFB is reduced as well as the corresponding amplifier bias current ICC.

Figure 11:
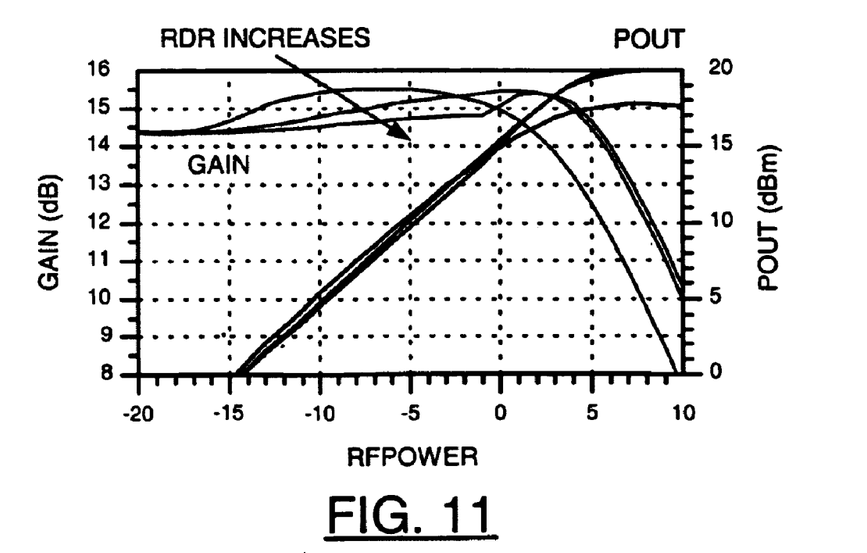
FIG. 11 is a diagram illustrating gain and output power versus input power.

Referring to FIG. 11, a graph is shown illustrating that as the resistance RDR increases, the onset of gain expansion occurs at increasing RF input powers. Such a tunable characteristic may be optimized for improving linearity as well as efficiency across a wide dynamic power range. The gain expansion characteristics may also be tailored for predistortion applications which often call for careful matching of the predistorted expansion characteristics to compression characteristics of an output amplifier stage.

Another benefit of the present invention is that the dynamic bias can be set in order to optimize linearity. Adjusting the ratio R1/R2 (which affects gain expansion) may also result in improved IP3 (the third order intercept point) and IM3 linearity or third order intermodulation suppression below the desired carrier, over as much as a 12 dB power range.

Figure 12:
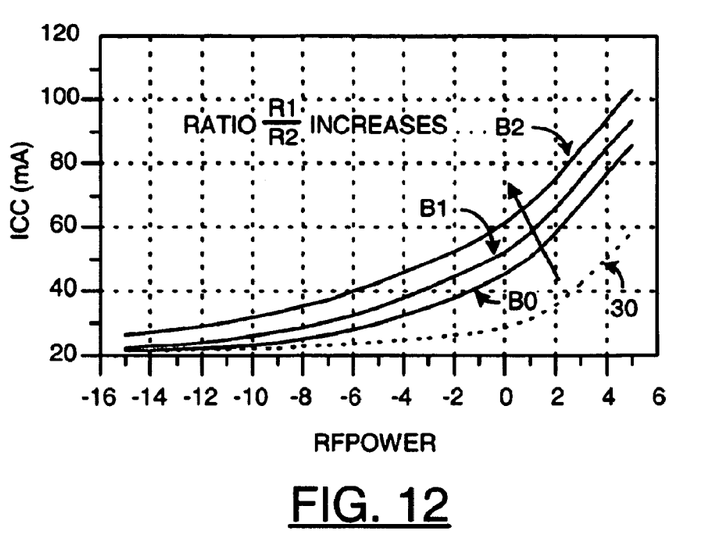
FIG. 12 is a diagram illustrating current versus power.

Referring to FIG. 12, a graph illustrating the amplifier bias current ICC (e.g., curves B0, B1, B2) versus RF input power for various ratios R1/R2 is shown. As the ratio R1/R2 increases, the dynamic current has a less abrupt ramp up behavior when compared to a conventional Darlington (shown with the dashed trace 30) without dynamic bias.

Figure 13:
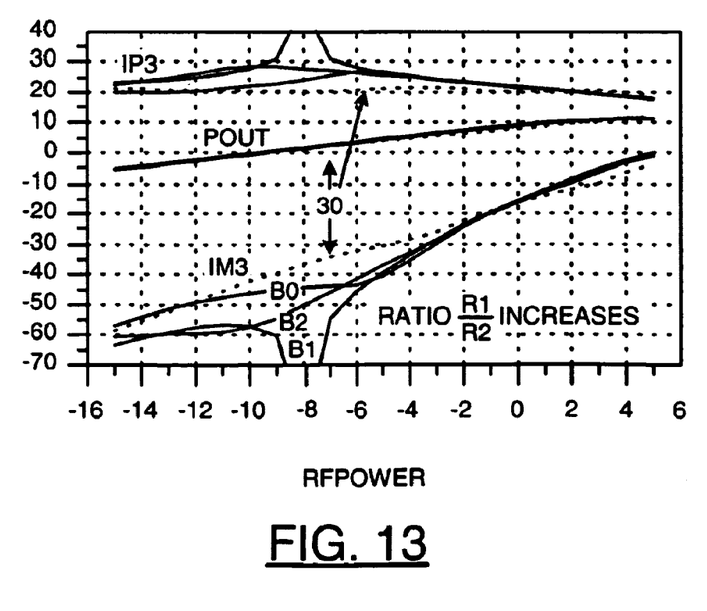
FIG. 13 is a diagram illustrating POUT, IM3 and IP3 versus RF input power.

Referring to FIG. 13, a graph illustrating Pout, IM3, and IP3 vs RF input power for various R1/R2 ratios of the dynamic bias is shown. FIG. 13 also shows the response of a conventional Darlington (shown as the dotted traces 30) without the use of the dynamic bias network. The dynamic bias network 102 shows an improvement in IP3 and IM3 response with respect to a conventional Darlington. FIG. 13 also indicates that there is an optimal ratio B1, which results in the largest improvement in IM3 suppression and absolute IP3 linearity. As much as a 5 dB improvement in IP3 may be maintained over an 8 dBm RF power range, with a peak linearity improvement of over 20 dBm at a single power level. The IM3 was suppressed by 10 dB over the same 8 dBm power range compared to the conventional Darlington response. The present invention has far reaching implications to the linearity of Darlington gain blocks and amplifiers in general.

Figure 14:
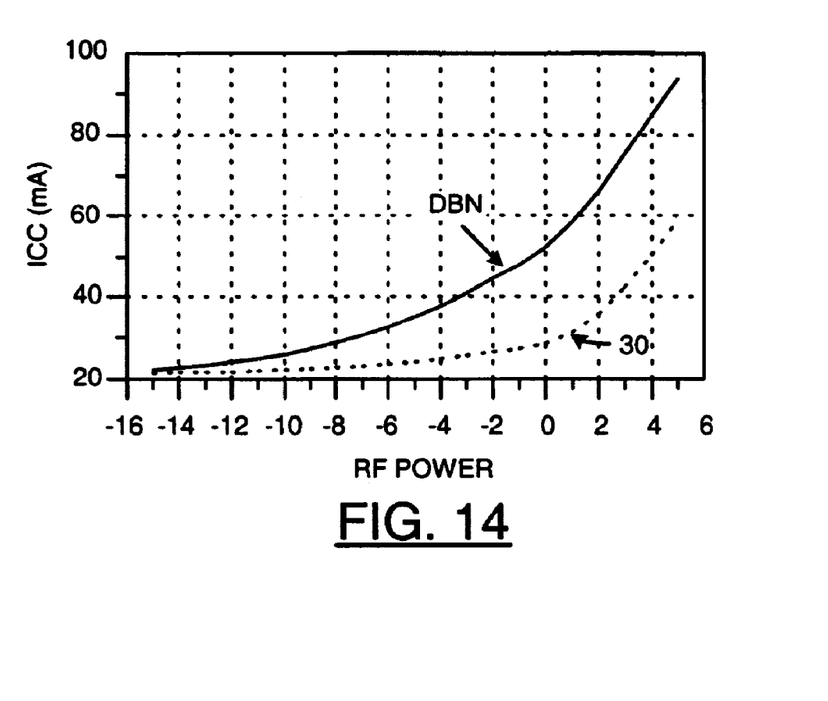
FIG. 14 is a diagram illustrating optimized dynamic bias.
Figure 15:
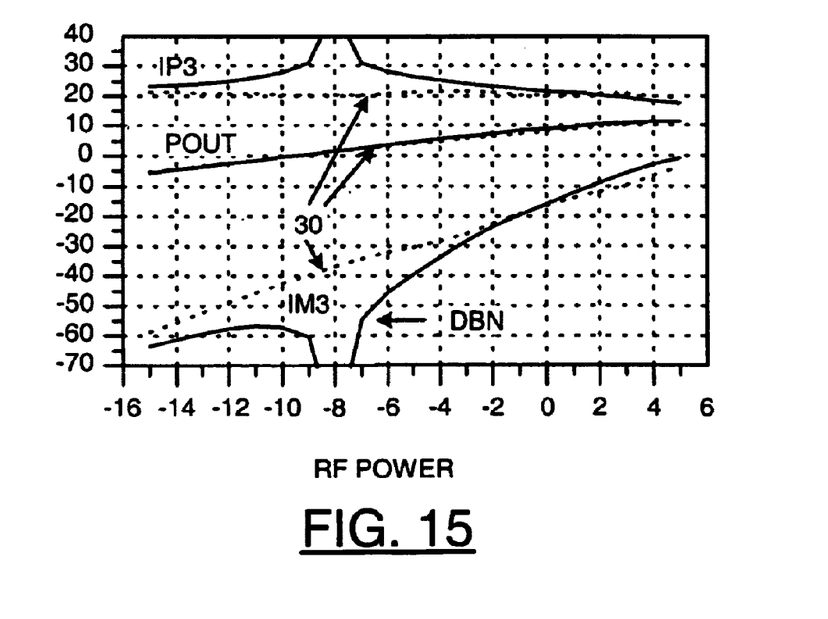
FIG. 15 is a diagram illustrating optimized dynamic bias.

As illustrated with gain expansion and dynamic bias characteristics, the adjustment of the resistor RDR also affects linearity response and may be used to optimize linearity. Referring to FIGS. 14 and 15, a graph illustrating an optimized dynamic bias (ICC) and linearity response for the case where the resistor RDR equals 100 ohms is shown. In FIGS. 14 and 15, a conventional Darlington response 30 is represented by a dotted line. FIG. 14 shows that the DBN 102 achieves greater dynamic ICC response with increasing RF input power than the conventional Darlington response 30. FIG. 15 illustrates the optimized IM3 and IP3 response where the resistor RDR equals 100 ohms. The IP3 is improved by 5 dB over an 7-8 dB power range which is equivalently represented by a 10 dB improvement in IM3 over the same range compared to the conventional Darlington amplifier case without the present invention.

Figure 16:
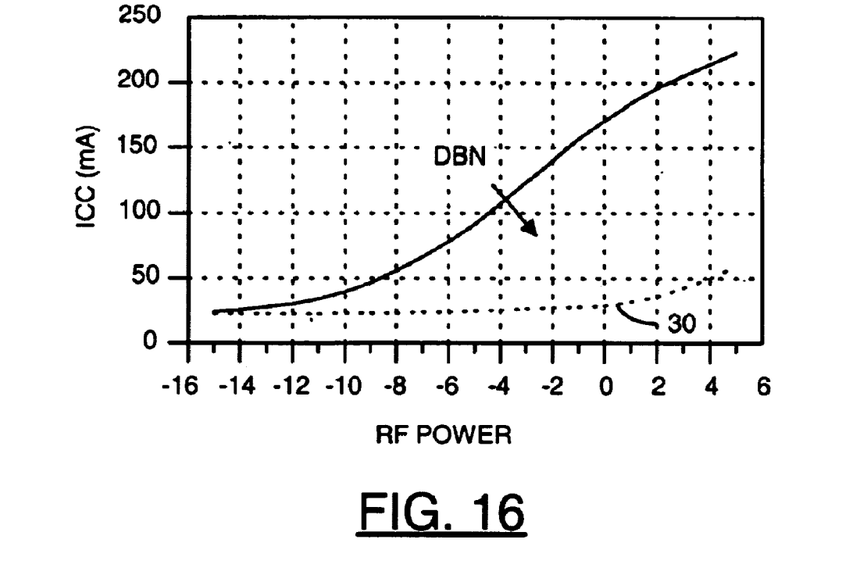
FIG. 16 is a diagram illustrating dynamic bias.
Figure 17:
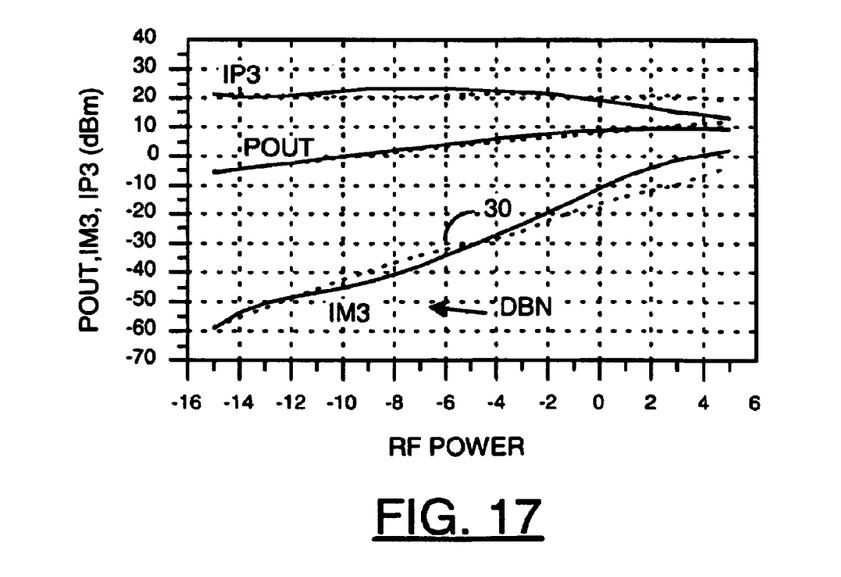
FIG. 17 is a diagram illustrating dynamic bias.

FIGS. 16 and 17 illustrate the dynamic bias (ICC) and linearity response for the case where the resistor RDR equals 10 ohms. FIGS. 16 and 17 illustrate a departure from an optimal solution for a lower value of the resistor RDR. In both FIGS. 16 and 17, a conventional Darlington response 30 is represented by a dotted line. FIG. 16 shows that the DBN achieves even greater dynamic ICC response with increasing RF input power than the optimal case in FIG. 14 where the resistor RDR equals 100 ohms. The lower value of the resistor RDR (e.g., 10 ohms) invokes less negative feedback in the dynamic bias network 102 and thus allows greater dynamic bias range. The dynamic bias threshold also is lower and moved to the left in FIG. 16. Less RF input power is needed to obtain the onset where the transistor QAFB turns on. FIG. 17 illustrates the less than optimal IM3 and IP3 response where the resistor RDR equals 10 ohms. For this case there is too much dynamic bias. The additional bias does not benefit the amplifier 104 in terms of linearity as can be observed by comparing the dashed and solid line of the IM3 responses of FIG. 17.

Figure 18:
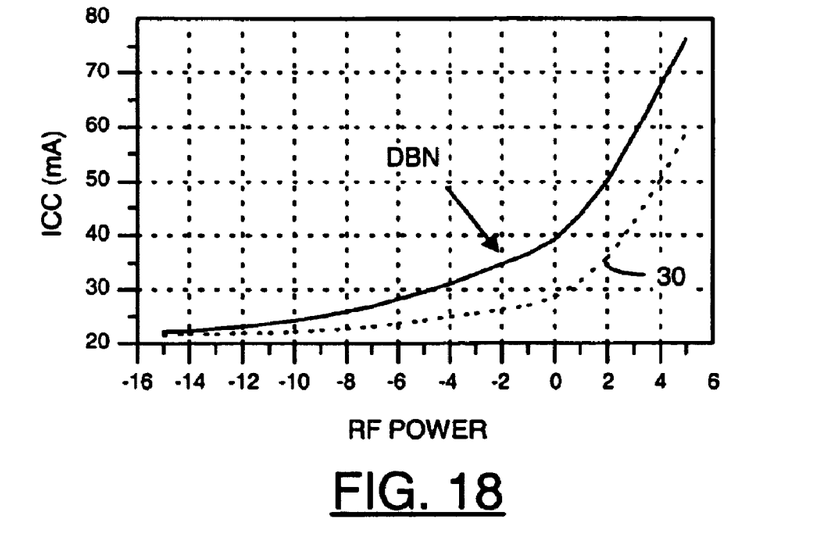
FIG. 18 is a diagram illustrating dynamic bias and linearity.
Figure 19:
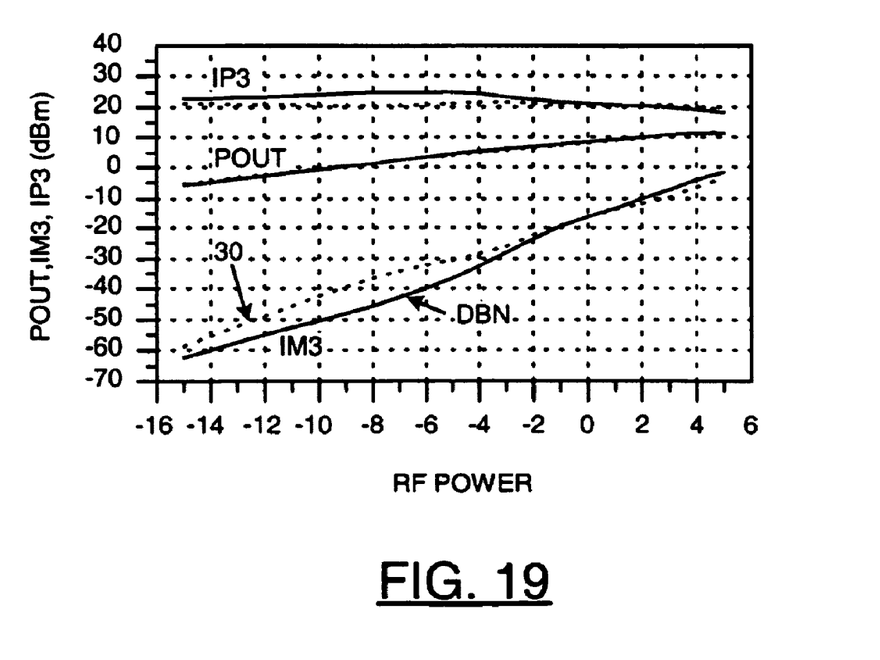
FIG. 19 is a diagram illustrating dynamic bias and linearity.

FIGS. 18 and 19 illustrate the dynamic bias (ICC) and linearity response for the case where the resistor RDR equals 200 ohms. FIG. 18 shows that when the value of the resistor RDR is 200 ohms, the dynamic bias network 102 has less dynamic ICC response with increasing RF input power than the optimal case where the resistor RDR is 100 ohms. The even higher value of the resistor RDR of 200 ohms invokes more negative feedback in the dynamic bias and thus inhibits the dynamic bias. The dynamic bias threshold is higher and has moved to the right in FIG. 18. More RF input power is needed to obtain the onset where the transistor QAFB turns on. FIG. 19 illustrates the less than optimal IM3 and IP3 response where the resistor RDR equals 200 ohms. In such a case, there is not enough dynamic bias, almost resembling the conventional Darlington case. As a consequence such a case does not benefit the amplifier in terms of linearity as much as the optimal case, although a slight improvement over the conventional Darlington is shown by comparing the dashed and solid line of the IM3 responses of FIG. 19.

The present invention may be tuned two ways (i) through the ratio R1/R2 of the resistors R1 and R2 and (ii) through the resistor RDR in order to optimize for the desired RF and DC characteristics. The nominal bias current IDC_RF may be made tunable which may provide the same effect as changing the ratio of R1/R2.

Figure 20:
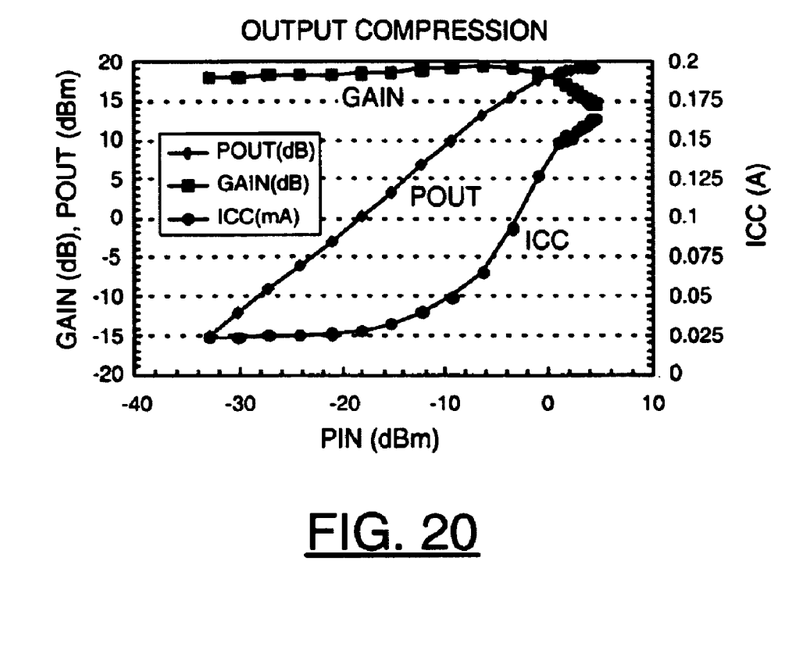
FIG. 20 is a diagram illustrating an output compression response.
Figure 21:
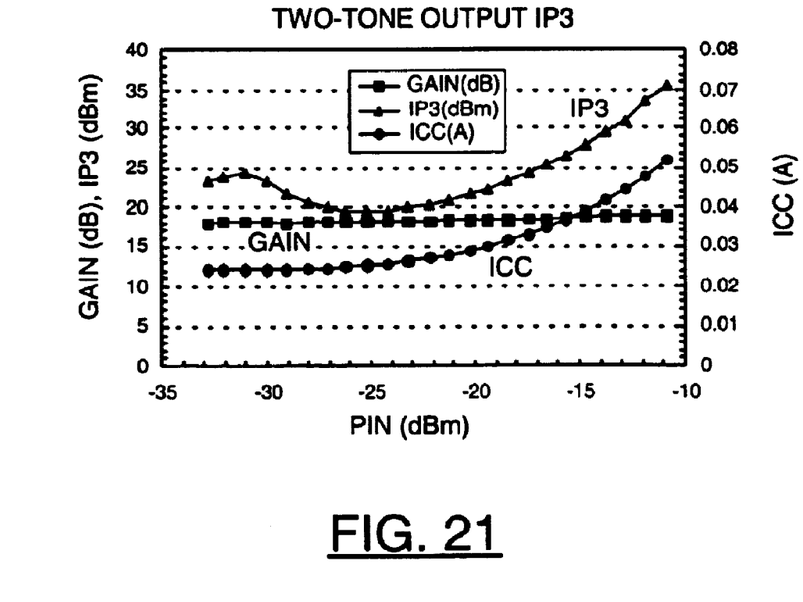
FIG. 21 is a diagram illustrating two tone output IP3 response.

Referring to FIGS. 20 and 21, diagrams illustrating output compression and the two-tone output third order intercept point of the output power versus the input power are shown. The plots shown in FIGS. 20 and 21 may be generated by the implementation of the dynamic bias network 102 when applied to a SiGe Darlington feedback amplifier 104. The gain reaches a maximum of 18 dB and P1 dB (or 1 dB compression point) is shown at a maximum of 18.8 dB. At a low input power, the ICC_quiescent is shown at approximately 25 mA with VCC=5V. The third order intercept point illustrates an example measured at 35 dBm.

Overall, the 1 dB compression point improved +8 dB over the conventional Darlington. The IP3 improved +15 dB and the IM3 linearity improved approximately 20 db over the IP3 and IM3 generated by the conventional Darlington. The improvement to the output power was accomplished because of adjustments made to the ratio R1/R2. The ICC_quiescent was equal to 25 mA with an ICC_compression equal to approximately 160 mA. The measured data in FIGS. 20 and 21 demonstrates that the dynamic feedback bias network 102 is process tolerant. The dynamic feedback bias 102 may be implemented into the following applications (i) gain blocks (e.g., SGC, SBB, InP and DHBTs) (ii) discrete bipolar solutions (e.g., 8343) (iii) power amplifier (e.g., InGaP), (iv) wireless local area network (WLAN) and/or (v) low noise amplifiers (LNAs).

Figure 22:
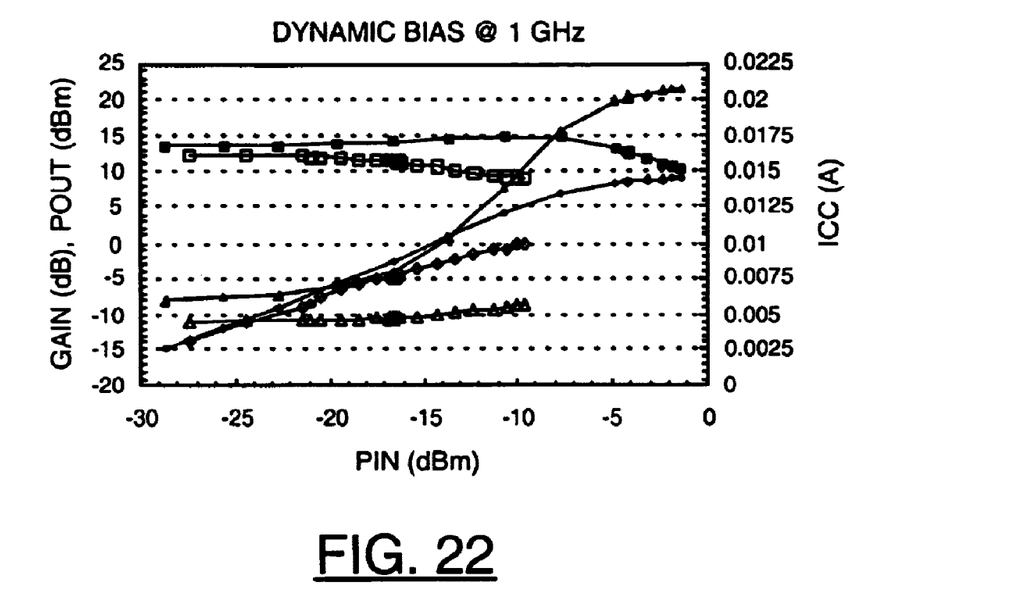
FIG. 22 is a diagram illustrating output compression and dynamic biasing at 1 GHz.
Figure 23:
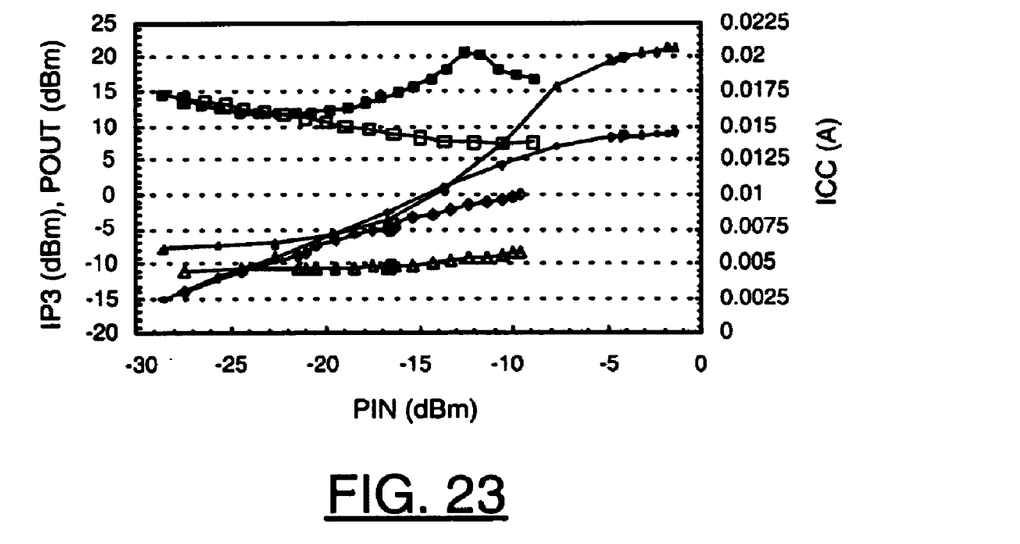
FIG. 23 is a diagram illustrating output IP3 response.

Referring to FIGS. 22 and 23, a diagram illustrating output compression dynamic bias and the output IP3 characteristics versus input power is shown. The plots shown in FIGS. 22 and 23 represent the implementation of the dynamic bias network 102 when applied to a SiGe1 common-emitter feedback amplifier 106'. With the dynamic feedback bias, the maximum gain measured was 14 dB. The measured maximum linear IP3 is shown as 14.5 dBm. The maximum compensated IP3_comp is shown as 20 dBm. The maximum 1 dB output power compression shown is 8.4 dBm. The quiescent ICC_Q shown is 6.3 mA and a ICC_COMPRESS is approximately 17 mA with VD equal to approximately 2.4V.

The notable difference between the data measured with the conventional common-emitter and the dynamic feedback bias was with the IP3_COMP and output power. In comparison, the measurements attained with the conventional common-emitter (i) a gain of 12 dB, (ii) an IP3_COMP of 7.5 dBm, (iii) an output power of −5 dBm and (iv) ICC_Q of 5 mA with an ICC-COMPRESS of approximately 6.5 mA and a VD of approximately 2.4V.

Overall, the gain increases 2 dB and retains better linearity than the gain with the conventional common-emitter. Additionally, significant increases in both the IP3_comp and P1 dB may be attained. The IP3 compression increases 12.5 and the P1 dB increases 13.4 dBm with the dynamic feedback bias over the conventional common emitter feedback amplifier.

The transistors described herein may be implemented as bipolar junction transistors (BJTs), heterojunction bipolar transistors (HBTs), double heterojunction bipolar transistors (DHBT) or pseudomorphic high electron mobility transistors (PHEMT). However, other transistors with similar characteristics may be implemented to meet the design criteria of a particular implementation. In particular, the various transistors of the present invention may be implemented using a variety of process technologies. For example, any or all semiconductors, including compound semiconductors, III-V semiconductors, Silicon Germanium (SiGe), Indium Gallium Phosphorous (InGaP), Indium Phosphide (InP), or Gallium Arsenide (GaAs) may be used. However, other process technologies may be implemented to meet the design criteria of a particular implementation.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
   an amplifier comprising at least one amplifier transistor, said amplifier configured to generate an output signal at a collector in response to an input signal received at a base;
   a threshold detection network coupled between said collector and said base of said amplifier transistor, and said threshold detection network (a) comprising a bias transistor having a collector coupled to said collector of said amplifier transistor and an emitter coupled to said base of said amplifier transistor and (b) configured to (i) sense a feedback current and (ii) provide a signal to the base of said amplifier transistor for dynamically changing bias current to the amplifiers wherein said bias current increases as a drive level of said input signal increases; and
   a bypass capacitor coupled to the base of said bias transistor.

2. The apparatus according to claim 1, wherein said bias transistor comprises a bipolar transistor.

3. The apparatus according to claim 1, further comprising:
   a first resistor (i) coupled to the emitter of said bias transistor and (ii) configured to set one or more characteristics of a dynamic bias current of the amplifier.

4. The apparatus according to claim 1, wherein said amplifier comprises a Darlington transistor pair.

5. The apparatus according to claim 1, wherein said apparatus is implemented in a SOT89 package which includes no more than two input/output terminals and one ground terminal.

6. The apparatus according to claim 1, wherein said apparatus is implemented in a self-biased Darlington amplifier.

7. The apparatus according to claim 1, wherein said amplifier comprises two parallel amplifiers for providing peak amplification for Doherty-type power amplifier operation.

8. The apparatus according to claim 1, wherein said amplifier comprises a predistortion stage where one or more amplitude and phase characteristics generated by said threshold detection network linearizes a successive output stage.

9. The apparatus according to claim 1, further comprising:
   a bypass capacitor configured to bypass the dynamic bias network in a feedback amplifier configuration.

10. The apparatus according to claim 1, wherein said threshold detection network comprises a first sense resistor connected between a base and an emitter of said bias transistor.

11. The apparatus according to claim 10, further comprising:
    a second sense resistor connected between a base and a collector of said bias transistor, wherein a ratio of said first and second sense resistors optimizes linearity.

12. The apparatus according to claim 10, further comprising:
    a second sense resistor connected between a base and a collector of said bias transistor, wherein a ratio of said first and second sense resistors optimizes class AB.

13. The apparatus according to claim 10, further comprising:
    a second sense resistor connected between a base and a collector of said bias transistor, wherein a ratio of said first and second sense resistors optimizes predistortion.

14. An apparatus comprising:
    amplifier means comprising at least one amplifier transistor, said amplifier means for generating an output signal at a collector in response to an input signal received at a base;
    detection network means coupled between said collector and said base of said amplifier transistor, and said detection means (a) comprising a bias transistor having a collector coupled to said collector of said amplifier transistor and an emitter coupled to said base of said amplifier transistor and (b) configured to (i) sense a feedback current and (ii) provide a signal to the base of said amplifier transistor for dynamically changing bias current to the amplifier, wherein said bias current increases as a drive level of said input signal increases; and
    bypass capacitor means coupled to the base of said bias transistor.

15. A method for controlling an amplifier comprising the steps of:
    (A) generating an output signal at a collector of an amplifier comprising at least one amplifier transistor in response to an input signal received at a base;
    (B) coupling a threshold detection network between said collector and said base of said amplifier transistor, said detection network (a) comprising a bias transistor having a collector coupled to said collector of said amplifier transistor and an emitter coupled to said base of said amplifier transistor and (b) configured to (i) sense a feedback current and (ii) provide a signal to the base of said amplifier transistor for dynamically changing bias current to the amplifier, wherein said bias current increases as a drive level of said input signal increases; and (C) coupling a bypass capacitor to the base of said bias transistor.

16. An apparatus comprising:

an amplifier comprising at least one amplifier transistor, said amplifier configured to generate an output signal at a collector in response to an input signal received at a base;

a threshold detection network coupled between said collector and said base of said amplifier transistor, and said threshold detection network (a) comprising a bias transistor having a collector coupled to said collector of said amplifier transistor and an emitter coupled to said base of said amplifier transistor and (b) configured to (i) sense a feedback current and (ii) provide a DC signal to the base of said amplifier transistor for dynamically sourcing bias current to the amplifier, wherein said threshold detection network comprises a first sense resistor connected between a base and an emitter of said bias transistor; and a bypass capacitor coupled to the base of said bias transistor.

17. The apparatus according to claim 1, wherein said signal provided to said base of said amplifier transistor comprises a DC signal.

18. The apparatus according to claim 14, wherein said signal provided to said base of said amplifier transistor comprises a DC signal.

19. The method according to claim 15, wherein said signal provided to said base of said amplifier transistor comprises a DC signal.

\* \* \* \* \*